United States Patent
Chou

(10) Patent No.: US 12,315,583 B1
(45) Date of Patent: May 27, 2025

(54) REPAIRABLE SEMICONDUCTOR MEMORY DEVICE

(71) Applicant: ELITE SEMICONDUCTOR MICROELECTRONICS TECHNOLOGY INC., Hsinchu (TW)

(72) Inventor: Min-Chung Chou, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 20 days.

(21) Appl. No.: 18/423,326

(22) Filed: Jan. 26, 2024

(51) Int. Cl.
| | | |
|---|---|---|
| G06F 11/00 | (2006.01) | |
| G06F 11/16 | (2006.01) | |
| G11C 29/00 | (2006.01) | |
| G11C 29/18 | (2006.01) | |
| G11C 29/44 | (2006.01) | |

(52) U.S. Cl.
CPC .......... *G11C 29/4401* (2013.01); *G06F 11/16* (2013.01); *G11C 29/18* (2013.01); *G11C 29/70* (2013.01); *G11C 29/76* (2013.01); *G11C 29/785* (2013.01)

(58) Field of Classification Search
CPC ....... G06F 11/16; G11C 29/70; G11C 29/785; G11C 29/76
See application file for complete search history.

(56) References Cited

U.S. PATENT DOCUMENTS

| | | | | |
|---|---|---|---|---|
| 6,055,204 | A * | 4/2000 | Bosshart | G11C 29/785 365/230.02 |
| 6,223,248 | B1 * | 4/2001 | Bosshart | G11C 29/76 711/105 |
| 8,867,286 | B2 * | 10/2014 | Wu | G11C 29/76 365/189.08 |
| 9,111,587 | B2 | 8/2015 | Ware et al. | |
| 2013/0155794 | A1 * | 6/2013 | Wu | G11C 29/76 365/200 |
| 2023/0343409 | A1 * | 10/2023 | Eichmeyer | G11C 29/787 |

* cited by examiner

*Primary Examiner* — Bryce P Bonzo
*Assistant Examiner* — Gabriella Kanani Shelton

(57) ABSTRACT

A repairable semiconductor memory device includes an input/output bus, a plurality of stacked memory chips, and a redundant repair unit. Each of the memory chips compares a memory address information with an address information to be repaired to generate a first comparison result for determining whether to allow the input/output bus to access the data corresponding to the memory address information in the memory chips. The redundancy repair unit compares the memory address information with the address information to be repaired to generate a second comparison result for determining whether to allow a redundant memory cell corresponding to the memory address information to be coupled to the input/output bus. In this way, the semiconductor memory device can repair any layer of the memory chips to improve the yield to solve the problem of previously having a lower yield.

10 Claims, 4 Drawing Sheets

REPAIRABLE SEMICONDUCTOR MEMORY DEVICE

BACKGROUND OF THE INVENTION

1. Field of the Invention

The present disclosure relates to a memory device, and in particular to a repairable semiconductor memory device.

2. Description of the Related Art

Currently, for electronic components with a standard architecture, such as memory chips, the use of a three-dimensional chip integration technology can smoothly expand a memory capacity according to existing chip manufacturing methods without the need of re-layout or manufacturing of a new photomask that meets memory requirements of new application hardware. The three-dimensional chip integration technology refers to a vertical interconnection process technology of through silicon via (TSV) which stacks multiple memory chips in the same package to form a semiconductor memory device. Each memory chip usually has at least one redundant memory block placed therein in order to repair its own memory chip.

However, the existing repair mechanism can only use the redundant memory blocks in a memory chip to repair damaged memory cells within the memory chip (that is, cross-layer repair cannot be implemented). Thus, when memory chips of other layers contain too many damaged memory cells and are unable to achieve full repair by using redundant memory blocks of their own, the semiconductor memory device packaged then has a lower yield.

Moreover, refer to FIG. 1 showing a schematic diagram of a memory device 10 compliant with open bit line architecture. The memory device 10 includes multiple memory cells 101, multiple word lines WL1 to WLm, multiple bit line groups consisting of multiple bit lines BL1 and BL3 and multiple bit lines /BL1 and /BL3, and multiple sensor amplifier groups AG consisting of multiple sensor amplifiers S/A. The memory cells 101 are divided into multiple memory sections, including two edge memory sections 102 and 103, and multiple non-edge memory sections S1 to Sn. Each of the memory cells 101 includes a storage capacitor (not shown) and an access transistor (not shown).

With such open bit line architecture, each bit line group (for example, the bit line groups BL1, /BL1 or the bit line groups BL3, /BL3) is coupled to one sensor amplifier S/A, and the two are disposed in directions opposite to each other on two sides of the corresponding sensor amplifier S/A. Thus, each of the non-edge memory sections S1 to Sn is coupled to the sensor amplifier groups AG arranged opposite to each other, and each of the edge memory sections 102 and 103 is coupled to only one sensor amplifier group AG. Thus, as a result of such architecture, a utilization rate of each of the edge memory sections 102 and 103 is only one half of that of any one of the non-edge memory sections S1 to Sn.

BRIEF SUMMARY OF THE INVENTION

Therefore, it is an object of the present disclosure to provide a repairable semiconductor memory device capable of repairing memory chips of any desired layer so as to improve a yield of a semiconductor memory device formed by the three-dimensional stacked memory packaging, thereby solving the issue of a lower yield caused by the inability of repairing memory chips of other layers of a repair mechanism of a current memory chip.

The repairable semiconductor memory device of the present disclosure includes an input/output bus, multiple memory chips, and a redundant repair unit.

The memory chips form a stack. Each of the memory chips is configured to receive memory address information, is coupled to the input/output bus, compares the memory address information with address to be repaired information to generate a first comparison result, and determines, according to the first comparison result, whether to allow the input/output bus to access data corresponding to the memory address information in the memory chips. The memory address information includes a memory chip identifier and a memory address. The address to be repaired information includes at least one memory chip to be repaired identifier and at least one corresponding memory to be repaired address.

The redundant repair unit is configured to receive the memory address information, is coupled to the input/output bus, and includes a redundant memory array. The redundant repair unit compares the memory address information with the address to be repaired information to generate a second comparison result, and determines, according to the second comparison result, whether to allow a redundant memory cell corresponding to the memory address in the redundant memory array to be coupled to the input/output bus.

The first comparison result and the second comparison result have a same logic level. When the logic level is a high logic level, the input/output bus cannot access data corresponding to the memory address information in the memory chips, and the redundant memory cell corresponding to the memory address in the redundant memory array is coupled to the input/output bus.

In some embodiments, each of the memory chips of the semiconductor memory device of the present disclosure includes a comparator, a controller, an address decoder, a memory array, and an input/output buffer.

In each of the memory chips, the comparator is configured to receive the memory address information, and has the address to be repaired information stored therein. The comparator is configured to compare the memory address information with the address to be repaired information to generate the first comparison result. The controller is coupled to the comparator so as to receive the first comparison result, and generates a control signal according to the first comparison result. The address decoder is configured to receive the memory address information, and generate a decoding address according to the memory address information. The memory array is coupled to the address decoder so as to receive the decoding address, and includes multiple memory cells arranged in a matrix. The memory array conducts a memory cell corresponding to the decoding address in the memory cells according to the decoding address. The input/output buffer is coupled to the memory array and the input/output bus, is coupled to the controller so as to receive the control signal, and is controlled by the control signal so as to be enabled or disabled. When the logic level of the first comparison result is a high logic level, the input/output buffer is controlled by the control signal and accordingly disabled, such that the input/output bus cannot access data corresponding to the memory cell via the input/output buffer.

In some embodiments, in the semiconductor memory device of the present disclosure, when the logic level of the first comparison result is a low logic level, the input/output buffer is controlled by the control signal and accordingly enabled, such that the input/output bus accesses data corresponding to the memory cell via the input/output buffer.

In some embodiments, the decoding address of the semiconductor memory device of the present disclosure includes a decoding row address and a decoding column address.

In some embodiments, the redundant repair unit of the semiconductor memory device of the present disclosure further includes a comparator, a controller, and an input/output buffer.

In the redundant repair unit, the comparator is configured to receive the memory address information, has the address to be repaired information stored therein, and is coupled to the redundant memory array. The comparator compares the memory address information with the address to be repaired information to generate the second comparison result, and outputs the memory address to the redundant memory array, such that the redundant memory array conducts the redundant memory cell therein corresponding to the memory address according to the memory address. The controller is coupled to the comparator so as to receive the second comparison result, and generates a control signal according to the second comparison result. The input/output buffer is coupled to the redundant memory array and the input/output bus, is coupled to the controller so as to receive the control signal, and is controlled by the control signal so as to be enabled or disabled. When the logic level of the second comparison result is a high logic level, the input/output buffer is controlled by the control signal and accordingly enabled, such that the redundant memory cell corresponding to the memory address in the redundant memory array is coupled to the input/output bus via the input/output buffer.

In some embodiments, in the semiconductor memory device of the present disclosure, when the logic level of the second comparison result is a low logic level, the input/output buffer is controlled by the control signal and accordingly disabled, such that the redundant memory cell corresponding to the memory address in the redundant memory array is not coupled to the input/output bus via the input/output buffer.

In some embodiments, in the semiconductor memory device of the present disclosure, when the memory chip identifier matches one of the at least one memory chip to be repaired identifier, and the memory address matches one of the at least one memory to be repaired address, the logic level of each of the first comparison result and the second comparison result is a high logic level.

In some embodiments, in the semiconductor memory device of the present disclosure, when the logic level of each of the first comparison result and the second comparison result is a low logic level, the input/output bus accesses data corresponding to the memory address information in the memory chips, and the redundant memory cell corresponding to the memory address in the redundant memory array is not coupled to the input/output bus.

In some embodiments, in the semiconductor memory device of the present disclosure, when the memory chip identifier does not match any one of the at least one memory chip to be repaired identifier, or the memory address does not match any one of the at least one memory to be repaired address, the logic level of each of the first comparison result and the second comparison result is a low logic level (that is, the logic level is a low logic level when any one of the memory chip identifier and the memory address does not match).

In some embodiments, in the semiconductor memory device of the present disclosure, each of the memory address and the at least one memory to be repaired address includes a column address and a row address.

The present disclosure achieves the following effects. When the logic level is a high logic level, the input/output bus cannot access data corresponding to the memory address information in the memory chips, and the redundant memory cell corresponding to the memory address in the redundant memory array is coupled to the input/output bus. As such, the redundant repair unit can be used to repair the memory chip of any layer in the memory chips, enabling the semiconductor memory device to have a higher yield.

BRIEF DESCRIPTION OF THE DRAWINGS

Other features and effects of the present disclosure will become more readily apparent in the embodiments described with reference to the accompanying drawings, wherein.

DETAILED DESCRIPTION OF THE INVENTION

In the following description of the present disclosure, details of the present disclosure are provided by way of the embodiments with reference to the accompanying drawings, so as to help a person skilled in the art to better understand the objects, features, and effects of the present disclosure. It should be noted that, in the description below and the appended claims, the terms "include" and "comprise" are used in the sense of an open manner, and are not to be construed as closed terms such as "consisting of . . . ". Moreover, the term "couple" is intended to represent indirect or direct coupling. Thus, if one apparatus is coupled to another apparatus, the connection in between can be implemented by direct coupling or be implemented by indirect coupling achieved with another apparatus in between or connection.

Figure 2:
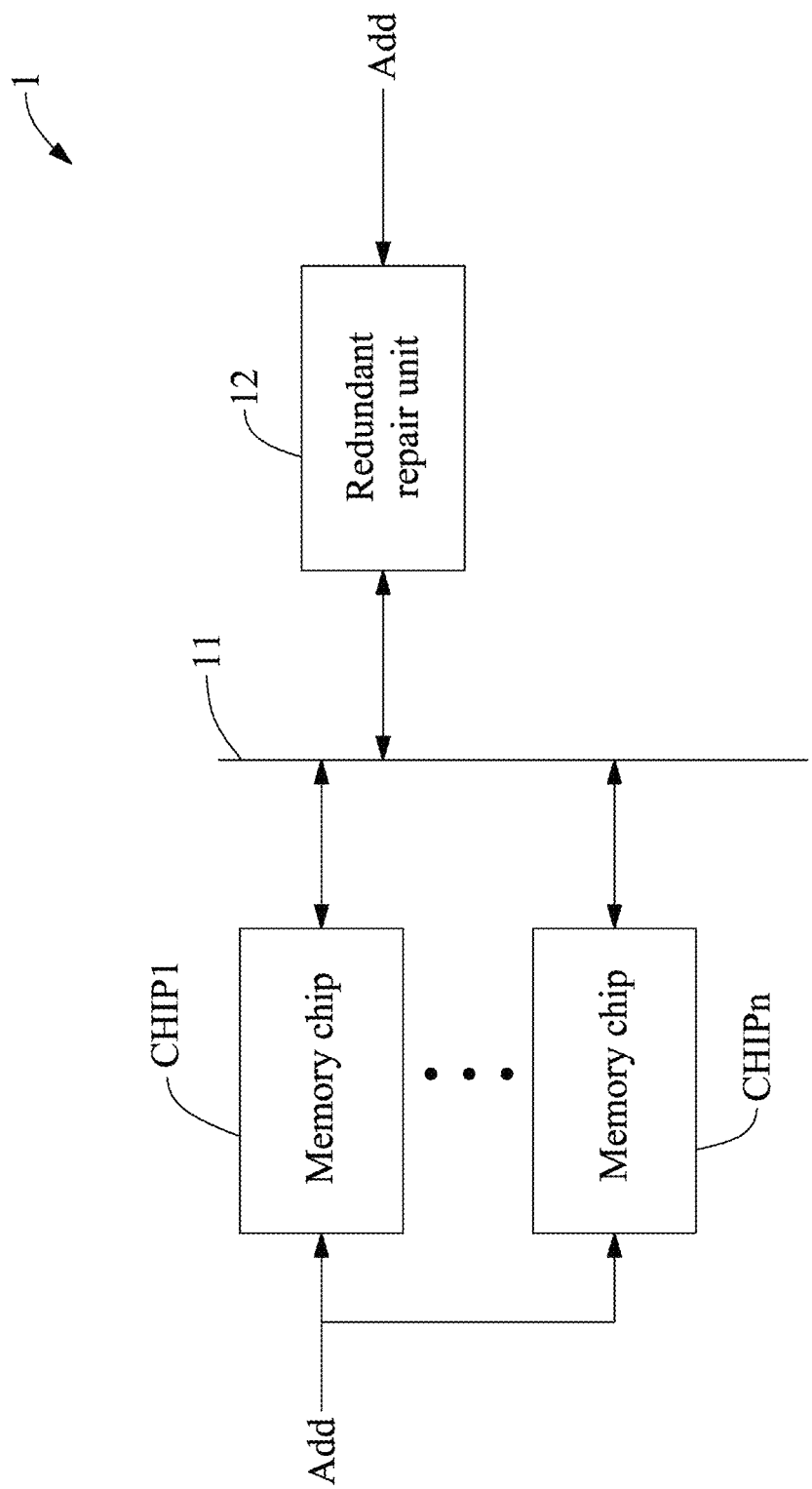
FIG. 2 is a block diagram of a repairable semiconductor memory device according to an embodiment of the present disclosure.
Figure 3:
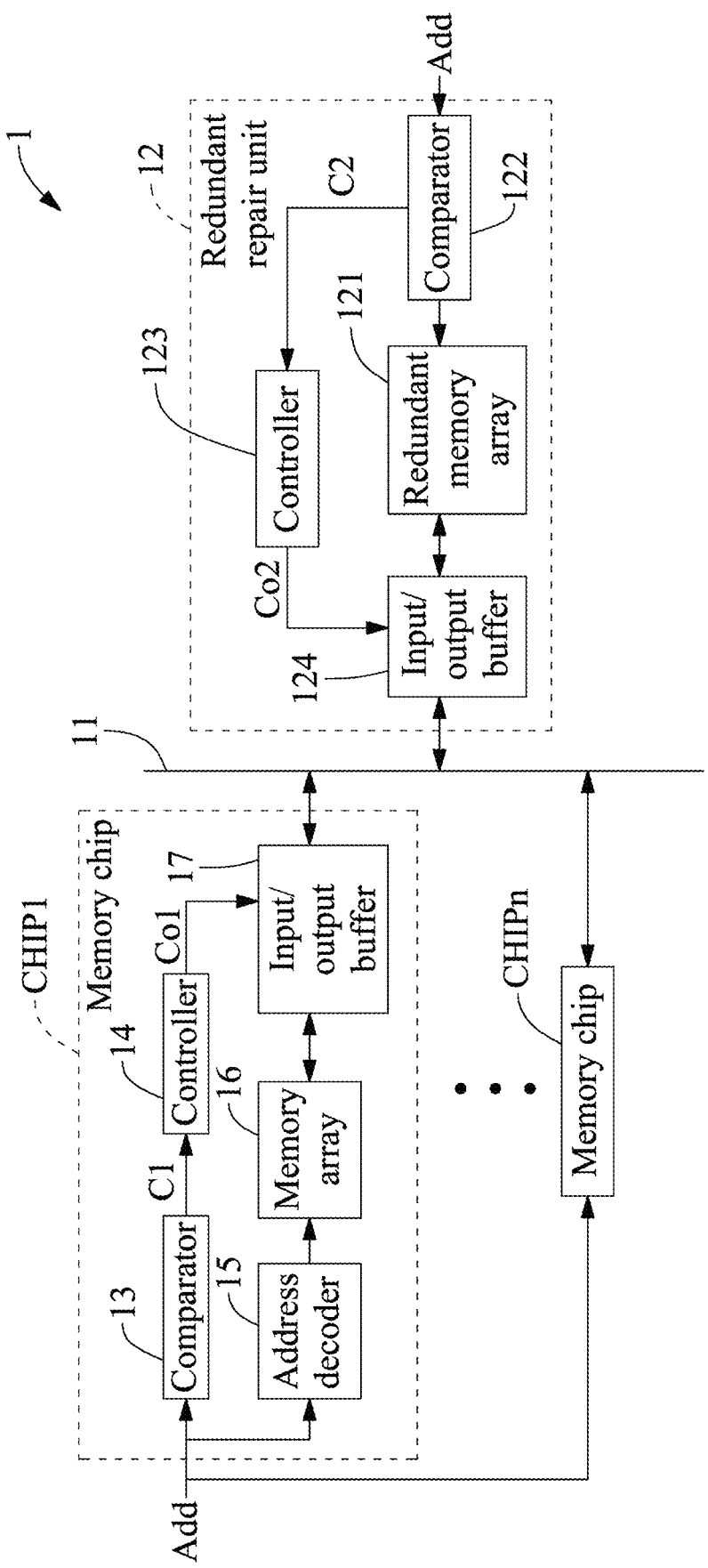
FIG. 3 is a block diagram for illustrating a memory chip and a redundant repair unit of an embodiment of the present disclosure.

Refer to FIG. 2 and FIG. 3 showing a repairable semiconductor memory device 1 according to an embodiment of the present disclosure. The semiconductor memory device 1 includes an input/output bus 11, multiple memory chips CHIP1 to CHIPn, and a redundant repair unit 12.

It should be noted that, during back-end processing of the semiconductor memory device 1 (that is, before the memory chips CHIP1 to CHIPn form a stack), a memory array of each of the memory chips CHIP1 to CHIPn can be tested first, so as to timely discover all damaged memory cells in the memory arrays and to obtain and store address to be repaired information into each of the memory chips CHIP1 to CHIPn and the redundant repair unit 12, for the use of subsequent repair of the memory chips. The address to be repaired information includes at least one memory chip to be repaired identifier and at least one corresponding memory to be repaired address. Each memory chip to be repaired identifier corresponds to one of the memory chips CHIP1 to CHIPn. The at least one memory to be repaired address includes a column address and a row address.

In an embodiment, the memory chips CHIP1 to CHIPn form a stack. Each of the memory chips CHIP1 to CHIPn is configured to receive memory address information Add, is coupled to the input/output bus 11, compares the memory address information Add with the address to be repaired information to generate a first comparison result C1, and determines, according to the first comparison result C1, whether to allow the input/output bus 11 to access data corresponding to the memory address information Add in the memory chips CHIP1 to CHIPn. The memory address information Add includes a memory chip identifier and a memory address. The memory address includes a column address and a row address. The memory chip identifier corresponds to one of the memory chips CHIP1 to CHIPn. The memory address information Add corresponds to memory cells of a memory array of one of the memory chips of the stacked memory chips CHIP1 to CHIPn. The memory chips CHIP1 to CHIPn transmit signals to one another by means of the through silicon via (TSV) interconnection technology. In an embodiment, each of the memory chips CHIP1 to CHIPn includes a comparator, a controller, an address decoder, a memory array, and an input/output buffer. For example, the memory chip CHIP1 includes a comparator 13, a controller 14, an address decoder 15, a memory array 16, and an input/output buffer 17. Refer to the description associated with the memory chip CHIP1 for details of the other memory chips. In FIG. 3, elements or related signal paths in the memory chip CHIPn are not depicted in order to keep the drawing simple and readily understandable.

The comparator 13 is configured to receive the memory address information Add, and has the address to be repaired information stored therein. The comparator 13 compares the memory address information Add with the address to be repaired information to generate the first comparison result C1. In an embodiment, when the memory chip identifier matches one of the at least one memory chip to be repaired identifier, and the memory address matches one of the at least one memory to be repaired address (that is, the corresponding memory chip needs to be repaired), a logic level of the first comparison result C1 is a high logic level "1"; when the memory chip identifier does not match any one of the at least one memory chip to be repaired identifier, or the memory address does not match any one of the at least one memory to be repaired address (that is, the corresponding memory chip does not need to be repaired), the logic level of the first comparison result C1 is a low logic level "0" (that is, the logic level is a low logic level when any one of the memory chip identifier and the memory address does not match). However, the present disclosure is not limited to the examples above.

The controller 14 is coupled to the comparator 13 so as to receive the first comparison result C1, and generates a control signal Co1 according to the first comparison result C1. The controller 14 can be, for example, a general-purpose or application-specific microprocessor.

The address decoder 15 is configured to receive the memory address information Add, and generate a decoding address according to the memory address information Add. The decoding address includes a decoding row address and a decoding column address. In an embodiment, the address decoder 15 is configured to decode the memory address in the memory address information Add to generate the decoding address. However, the present disclosure is not limited to the example above. In other embodiments, the address decoder 15, instead of decoding the memory address, directly uses the memory address as the decoding address.

The memory array 16 is coupled to the address decoder 15 so as to receive the decoding address, and includes multiple memory cells (not shown) arranged in a matrix. The memory array 16 conducts a memory cell corresponding to the decoding address in the memory cells according to the decoding address. It should be noted that, when the memory chip identifier matches an identifier of the memory chip corresponding to the memory array 16, the memory array 16 is activated and conducts the memory cell corresponding to the decoding address. Since the memory array 16 is well-known to a person of ordinary skill in the technical field of memories, operation details thereof are omitted herein for the sake of conciseness. Moreover, to keep the drawing readily understandable, other elements (for example, including multiple memory blocks each connected to the address decoder 15 via respective word lines and connected to the input/output buffer 17 via bit lines, and each memory block can include multiple memory cells, each memory cell includes a storage capacitor and an access transistor) in the memory array 16 and related signal paths are not depicted in FIG. 3. Moreover, in an embodiment, the memory array 16 is a dynamic random access memory (DRAM) array. However, the present disclosure is not limited to the example above. The form of the memory array 16 can be a volatile memory array or a non-volatile memory array, both of which can be applied in embodiments.

The input/output buffer 17 is coupled to the memory array 16 and the input/output bus 11, is coupled to the controller 14 so as to receive the control signal Co1, and is controlled by the control signal Co1 so as to be enabled or disabled. In an embodiment, when the logic level of the first comparison result C1 is a high logic level (that is, the memory cell corresponding to the memory address information Add needs to be repaired), the input/output buffer 17 is controlled by the control signal Co1 and accordingly disabled, such that the input/output bus 11 cannot access data corresponding to the memory cell via the input/output buffer 17. When the logic level of the first comparison result C1 is a low logic level (that is, the memory cell corresponding to the memory address information Add does not need to be repaired), the input/output buffer 17 is controlled by the control signal Co1 and is accordingly enabled, such that the input/output bus 11 accesses data corresponding to the memory cell which corresponds to the decoding address (that is, the corresponding memory address in the memory address information Add) in the memory array 16 via the input/output buffer 17.

For example, if the input/output buffer 17 is controlled by the control signal Co1 and accordingly disabled, an input/output port (or for example, an input/output switch) (not shown) in the input/output buffer 17 is disabled (or for example, turned off), such that the input/output bus 11 cannot access the data corresponding to the memory cell via the input/output buffer 17. If the input/output buffer 17 is controlled by the control signal Co1 and accordingly enabled, an input/output port (or for example, an input/output switch) in the input/output buffer 17 is enabled (or for example, turned on), such that the input/output bus 11 can access the data corresponding to the memory cell via the input/output buffer 17.

The redundant repair unit 12 is configured to receive the memory address information Add, is coupled to the input/output bus 11 and includes a redundant memory array 121. The redundant memory array 121 includes multiple redundant memory cells (not shown) arranged in a matrix. The redundant repair unit 12 compares the memory address information Add with the address to be repaired information to generate a second comparison result C2, and determines, according to the second comparison result C2, whether to allow a redundant memory cell corresponding to the memory address in the redundant memory array 121 to be coupled to the input/output bus 11. A logic level of the second comparison result C2 is the same as the logic level of the first comparison result C1. It should be noted that, since the redundant memory array 121 is well-known to a person of ordinary skill in the technical field of memories, operation details thereof are omitted herein for the sake of conciseness. Moreover, to keep the drawings readily understandable, other elements and related signal paths in the redundant memory array 121 are not depicted in FIG. 3. Moreover, the form of the redundant memory array 121 can be a volatile memory or a non-volatile memory, both of which can be applied in embodiments. In addition, in an embodiment, the semiconductor memory device 1 includes one redundant repair unit 12 for example. However, the present disclosure is not limited to the example above. In other embodiments, the semiconductor memory device 1 can include multiple redundant repair units.

In an embodiment, the redundant repair unit 12 further includes a comparator 122, a controller 123, and an input/output buffer 124.

The comparator 122 is configured to receive the memory address information Add, has the address to be repaired information stored therein, and is coupled to the redundant memory array 121. The comparator 122 compares the memory address information Add with the address to be repaired information to generate the second comparison result C2, and directly outputs the memory address in the memory address information Add to the redundant memory array 121, such that the redundant memory array 121 conducts the redundant memory cell therein corresponding to the memory address according to the memory address.

The controller 123 is coupled to the comparator 122 so as to receive the second comparison result C2, and generates a control signal Co2 according to the second comparison result C2. The controller 123 can be, for example, a general-purpose or application-specific microprocessor.

The input/output buffer 124 is coupled to the redundant memory array 121 and the input/output bus 11, is coupled to the controller 123 so as to receive the control signal Co2, and is controlled by the control signal Co2 so as to be enabled or disabled. Operation principles for disabling and enabling the input/output buffer 124 are similar to those of the input/output buffer 17, and are thus omitted herein. In an embodiment, when the logic level of the second comparison result C2 is a low logic level (that is, the logic level of the first comparison result C1 is a low logic level, which means that the memory cell corresponding to the memory address information Add does not need to be repaired), the input/output buffer 124 is controlled by the control signal Co2 and accordingly disabled, such that the redundant memory cell corresponding to the memory address in the redundant memory array 121 is not coupled to the input/output bus 11 via the input/output buffer 124.

When the logic level of the second comparison result C2 is a high logic level (that is, the logic level of the first comparison result C1 is a high logic level, which means that the memory cell corresponding to the memory address information Add needs to be repaired), the input/output buffer 124 is controlled by the control signal Co2 and accordingly enabled, such that the redundant memory cell corresponding to the memory address in the redundant memory array 121 is coupled to the input/output bus 11 via the input/output buffer 124. At this point in time, the redundant memory cell corresponding to the memory address in the redundant memory array 121 can be used in substitution for the (damaged) memory cell corresponding to the memory address in the memory chip which corresponds to the memory chip identifier, so as to repair the damaged memory chip. Since the memory address information Add corresponds to memory cells of a memory array of one of the memory chips of the stacked memory chips CHIP1 to CHIPn, the redundant memory array 121 can be used to repair one of the memory chips of the stacked memory chips CHIP1 to CHIPn. For example, when the memory chip identifier in the memory address information Add corresponds to the memory chip CHIP1, the redundant memory cell corresponding to the memory address in the redundant memory array 121 can be used to repair the memory cell (not shown) corresponding to the decoding address (that is, the corresponding memory address in the memory address information Add) in the memory array 16 of the memory chip CHIP1; when the memory chip identifier in the memory address information Add corresponds to the memory chip CHIPn, the redundant memory array 121 can be used to repair the memory cell corresponding to the decoding address in the memory array (not shown) of the memory chip CHIPn. As such, the redundant repair unit 12 of the present disclosure can be used to repair the memory chip of any layer of the memory chips CHIP1 to CHIPn, enabling the semiconductor memory device 1 to have a higher yield. Moreover, the redundant repair unit 12 and the memory chips CHIP1 to CHIPn are elements separate from one another, and a storage space of the redundant memory array 121 is modifiable. In other embodiments, the redundant repair unit 12 is not limited to repairing one of the memory cells of one memory chip of the memory chips CHIP1 to CHIPn. When the memory address information Add includes multiple memory chip identifiers and multiple memory addresses, the redundant repair unit 12 can also be used to repair multiple memory chips of the memory chips CHIP1 to CHIPn.

Figure 4:
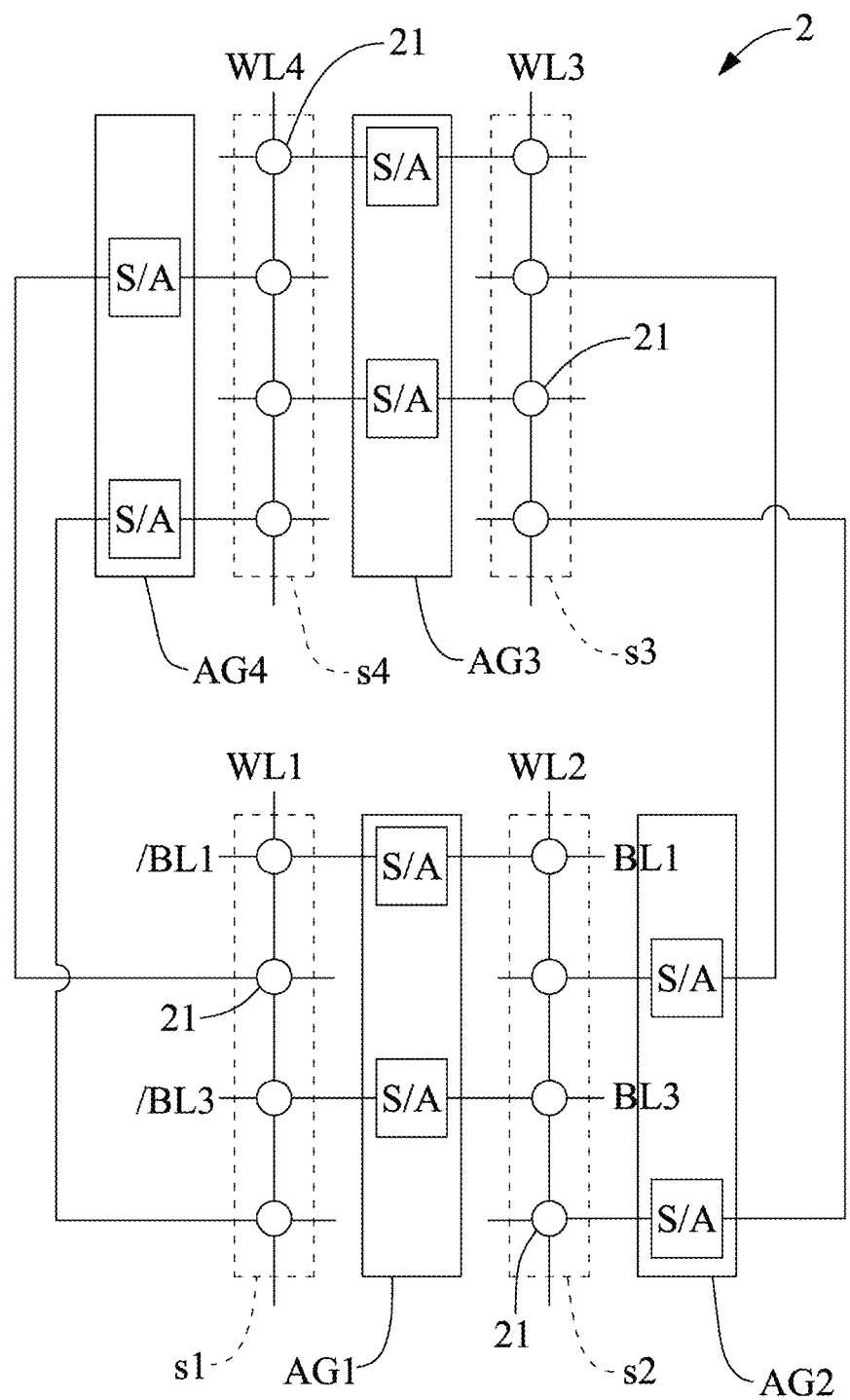
FIG. 4 is a schematic diagram of a memory device conforming to open bit line architecture according to an embodiment of the present disclosure.

Refer to FIG. 4 showing a schematic diagram of a memory device 2 conforming to open bit line architecture according to an embodiment of the present disclosure. The memory device 2 includes multiple memory cells 21, multiple word lines WL1 to WL4, multiple bit line groups consisting of multiple bit lines BL1 and BL3 and multiple bit lines/BL1 and/BL3, and multiple sensor amplifier groups AG1 to AG4 consisting of multiple sensor amplifiers S/A. The memory cells 21 are divided into multiple memory sections, including multiple memory sections s1 to s4. Each of the memory cells 21 includes a storage capacitor (not shown) and an access transistor (not shown). The memory device 2 is a dynamic random access memory (DRAM) device. In an embodiment, the memory device 2 includes four memory sections s1 to s4 and four sensor amplifiers AG1 to AG4 for example. However, the numbers of the memory cells and sensor amplifier groups included in the memory device 2 are not limited to the examples above.

The memory sections s1 and s2 and the sensor amplifier groups AG1 and AG2 are located in a first layer of a memory section stack, the memory sections s3 and s4 and the sensor amplifier groups AG3 and AG4 are located in a second layer of the memory section stack. However, the present disclosure is not limited to the examples above. The first layer and the second layer are stacked in the same package by means of the direct bond interconnect (DBI) interconnection manufacturing technology to form the memory device 2. In the front-end-of-line (FEOL) for manufacturing semiconductors, the memory section s1 and the sensor amplifier group AG4 are coupled to each other by means of the DBI interconnection manufacturing technology. The memory section s3 and the sensor amplifier group AG2 are coupled to each other by means of the DBI interconnection manufacturing technology.

Figure 1:
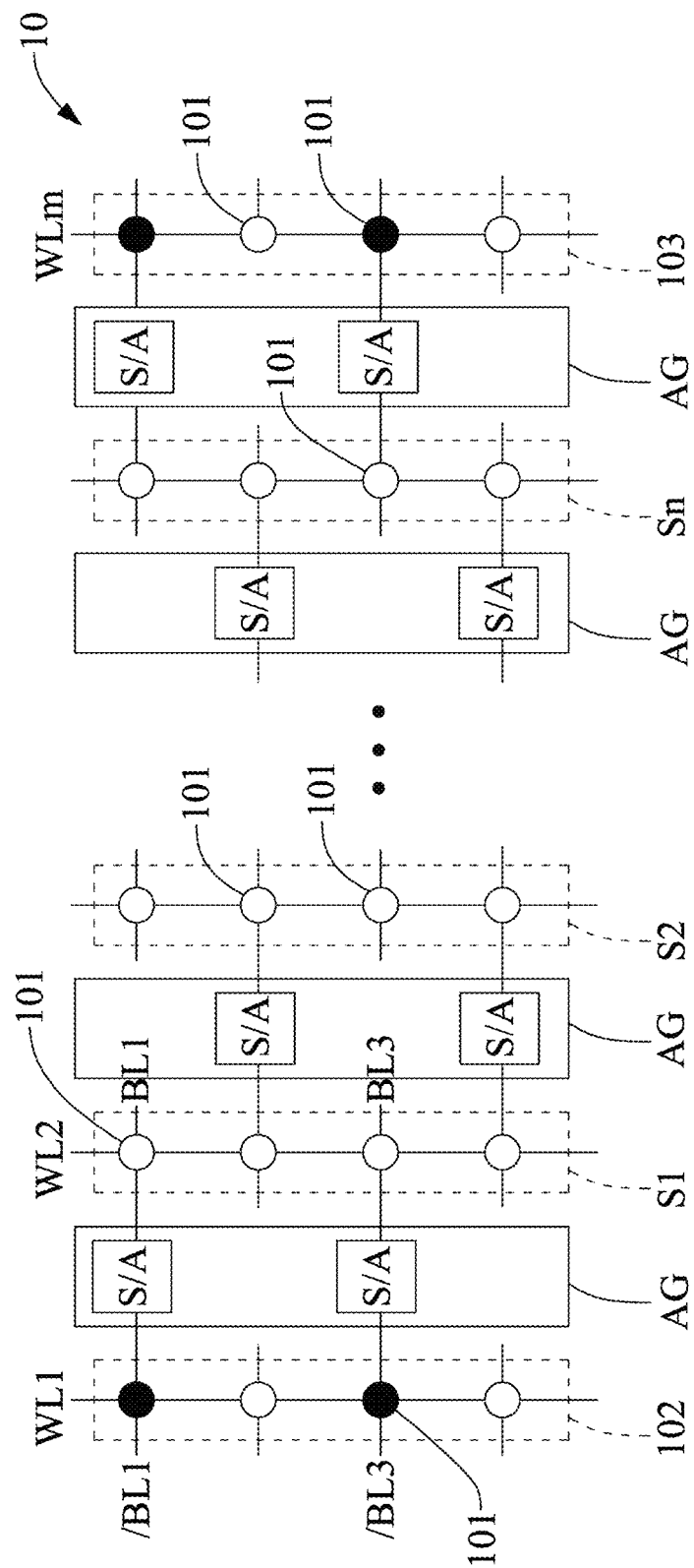
FIG. 1 is a schematic diagram of a memory device conforming to open bit line architecture of the prior art.

In an embodiment, the memory sections s1 to s4 and the sensor amplifier groups AG1 to AG4 are coupled in a staggered arrangement, and the last sensor amplifier group AG4 is coupled to the first memory section s1. With such open bit line architecture, each bit line group (for example, the bit line groups BL1, /BL1 or the bit line groups BL3, /BL3) is coupled to one sensor amplifier S/A, and the two are disposed in directions opposite to each other on two sides of the corresponding sensor amplifier S/A. Thus, each of the memory sections s1 to s4 is coupled to two sensor amplifier groups arranged opposite to each other. For example, the memory section s1 is coupled to the two sensor amplifier groups AG1 and AG4 arranged opposite to each other, and the memory section s3 is coupled to the two sensor amplifier groups AG2 and AG3 arranged opposite to each other. As such, the architecture above provides the memory sections s1 to s4 with a utilization rate of 100%, without having to additionally provide the edge memory sections 102 and 103 as in the prior art shown in FIG. 1. Thus, when the number of memory sections with a utilization rate of 100% in the memory device 2 is equal to the number of memory sections with a utilization rate of 100% in the memory device 10 in FIG. 1, since the additionally provided edge memory sections are eliminated from the memory device 2 in comparison with the memory device 10, the memory device 2 has a smaller size.

The description above provides merely preferred embodiments of the present disclosure, and is not to be construed as limitations to the scope of implementation of the present disclosure. All simple and equivalent variations and modifications made to the embodiments based on the claims and the description of the present disclosure are encompassed within the scope of the present disclosure.

What is claimed is:

1. A repairable semiconductor memory device, comprising:
    an input/output bus;
    a plurality of memory chips, forming a stack, each of the memory chips configured to receive memory address information, coupled to the input/output bus, comparing the memory address information with address to be repaired information to generate a first comparison result, and determining, according to the first comparison result, whether to allow the input/output bus to access data corresponding to the memory address information in the memory chips, wherein the memory address information comprises a memory chip identifier and a memory address, the address to be repaired information comprises at least one memory chip to be repaired identifier and at least one corresponding memory to be repaired address; and
    a redundant repair unit, configured to receive the memory address information, coupled to the input/output bus, and comprising a redundant memory array, the redundant repair unit comparing the memory address information with the address to be repaired information to generate a second comparison result, and determining, according to the second comparison result, whether to allow a redundant memory cell corresponding to the memory address in the redundant memory array to be coupled to the input/output bus,
    wherein, the first comparison result and the second comparison result have a same logic level, and when the logic level of each of the first comparison result and the second comparison result is a high logic level, the input/output bus cannot access data corresponding to the memory address information in the memory chips, and the redundant memory cell corresponding to the memory address in the redundant memory array is coupled to the input/output bus.

2. The semiconductor memory device according to claim 1, wherein each of the memory chips comprises:
    a comparator, configured to receive the memory address information, and having the address to be repaired information stored therein, the comparator comparing the memory address information with the address to be repaired information to generate the first comparison result;
    a controller, coupled to the comparator so as to receive the first comparison result, and generating a control signal according to the first comparison result;
    an address decoder, configured to receive the memory address information, and generating a decoding address according to the memory address information;
    a memory array, coupled to the address decoder so as to receive the decoding address, and comprising multiple memory cells arranged in a matrix, the memory array conducting a memory cell corresponding to the decoding address in the memory cells according to the decoding address; and
    an input/output buffer, coupled to the memory array and the input/output bus, coupled to the controller so as to receive the control signal, and controlled by the control signal so as to be enabled or disabled, wherein when the logic level of the first comparison result is the high logic level, the input/output buffer is controlled by the control signal and accordingly disabled, such that the input/output bus cannot access data corresponding to the memory cell via the input/output buffer.

3. The semiconductor memory device according to claim 2, wherein when the logic level of the first comparison result is a low logic level, the input/output buffer is controlled by the control signal and accordingly enabled, such that the input/output bus accesses data corresponding to the memory cell via the input/output buffer.

4. The semiconductor memory device according to claim 2, wherein the decoding address comprises a decoding row address and a decoding column address.

5. The semiconductor memory device according to claim 1, wherein the redundant repair unit further comprises:
    a comparator, configured to receive the memory address information, having the address to be repaired information stored therein, and coupled to the redundant memory array, the comparator comparing the memory address information with the address to be repaired information to generate the second comparison result, and outputting the memory address to the redundant memory array, such that the redundant memory array conducts the redundant memory cell therein corresponding to the memory address according to the memory address;
    a controller, coupled to the comparator so as to receive the second comparison result, and generating a control signal according to the second comparison result; and
    an input/output buffer, coupled to the redundant memory array and the input/output bus, coupled to the controller so as to receive the control signal, and controlled by the control signal so as to be enabled or disabled, wherein when the logic level of the second comparison result is the high logic level, the input/output buffer is controlled by the control signal and accordingly enabled, such that the redundant memory cell corresponding to the memory address in the redundant memory array is coupled to the input/output bus via the input/output buffer.

6. The semiconductor memory device according to claim 5, wherein when the logic level of the second comparison result is a low logic level, the input/output buffer is controlled by the control signal and accordingly disabled, such that the redundant memory cell corresponding to the memory address in the redundant memory array is not coupled to the input/output bus via the input/output buffer.

7. The semiconductor memory device according to claim 1, wherein when the memory chip identifier matches one of the at least one memory chip to be repaired identifier, and the memory address matches one of the at least one memory to be repaired address, the logic level of each of the first comparison result and the second comparison result is the high logic level.

8. The semiconductor memory device according to claim 1, wherein when the logic level of each of the first comparison result and the second comparison result is a low logic level, the input/output bus accesses data corresponding to the memory address information in the memory chips, and the redundant memory cell corresponding to the memory address in the redundant memory array is not coupled to the input/output bus.

9. The semiconductor memory device according to claim 8, wherein when the memory chip identifier does not match any one of the at least one memory chip to be repaired identifier, or the memory address does not match any one of the at least one memory to be repaired address, the logic level of each of the first comparison result and the second comparison result is the low logic level.

10. The semiconductor memory device according to claim 1, wherein each of the memory address and the at least one memory to be repaired address comprises a column address and a row address.

* * * * *